(12) United States Patent
Zitouni et al.

(10) Patent No.: US 9,178,027 B1
(45) Date of Patent: Nov. 3, 2015

(54) BIDIRECTIONAL TRENCH FET WITH GATE-BASED RESURF

(71) Applicants: Moaniss Zitouni, Gilbert, AZ (US); Edouard D. de Fresart, Tempe, AZ (US); Pon Sung Ku, Gilbert, AZ (US); Michael F. Petras, Phoenix, AZ (US); Ganming Qin, Chandler, AZ (US); Evgueniy N. Stefanov, Vieille Toulouse (FR); Dragan Zupac, Chandler, AZ (US)

(72) Inventors: Moaniss Zitouni, Gilbert, AZ (US); Edouard D. de Fresart, Tempe, AZ (US); Pon Sung Ku, Gilbert, AZ (US); Michael F. Petras, Phoenix, AZ (US); Ganming Qin, Chandler, AZ (US); Evgueniy N. Stefanov, Vieille Toulouse (FR); Dragan Zupac, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/457,824

(22) Filed: Aug. 12, 2014

(51) Int. Cl.
*H01L 29/66* (2006.01)
*H01L 29/423* (2006.01)
*H01L 29/78* (2006.01)
*H01L 27/088* (2006.01)
*H01L 29/40* (2006.01)
H01L 29/417 (2006.01)

(52) U.S. Cl.
CPC .......... *H01L 29/4236* (2013.01); *H01L 27/088* (2013.01); *H01L 29/402* (2013.01); *H01L 29/404* (2013.01); *H01L 29/66666* (2013.01); *H01L 29/7827* (2013.01); *H01L 29/41741* (2013.01)

(58) Field of Classification Search
CPC ............... H01L 29/402; H01L 29/404; H01L 29/41741
USPC .................................... 257/330, 331
See application file for complete search history.

(56) References Cited

U.S. PATENT DOCUMENTS

| | | | |
|---|---|---|---|
| 2009/0166728 A1* | 7/2009 | Pan ...................... | H01L 29/0623 257/330 |
| 2013/0307060 A1 | 11/2013 | Wang et al. | |
| 2013/0344667 A1 | 12/2013 | Qin et al. | |
| 2014/0027813 A1* | 1/2014 | Kuruc ............... | H01L 29/66348 257/139 |
| 2014/0054682 A1* | 2/2014 | Padmanabhan ....... | H01L 29/404 257/330 |
| 2015/0108568 A1* | 4/2015 | Terrill ................. | H01L 29/7813 257/331 |

* cited by examiner

*Primary Examiner* — David Vu
*Assistant Examiner* — Brandon Fox
(74) *Attorney, Agent, or Firm* — Lempia Summerfield Katz LLC

(57) ABSTRACT

A device includes a semiconductor substrate having a surface, a trench in the semiconductor substrate extending vertically from the surface, a body region laterally adjacent the trench, spaced from the surface, having a first conductivity type, and in which a channel is formed during operation, a drift region between the body region and the surface, and having a second conductivity type, a gate structure disposed in the trench alongside the body region, recessed from the surface, and configured to receive a control voltage is applied to control formation of the channel, and a gate dielectric layer disposed along a sidewall of the trench between the gate structure and the body region. The gate structure and the gate dielectric layer have a substantial vertical overlap with the drift region such that electric field magnitudes in the drift region are reduced through application of the control voltage.

20 Claims, 3 Drawing Sheets

US 9,178,027 B1

BIDIRECTIONAL TRENCH FET WITH GATE-BASED RESURF

FIELD OF INVENTION

The present embodiments relate to semiconductor devices.

BACKGROUND

Integrated circuits (ICs) and other electronic devices often include arrangements of interconnected field effect transistor (FET) devices, also called metal-oxide-semiconductor field effect transistors (MOSFETs). A typical FET device includes a gate electrode as a control electrode, and spaced apart source and drain electrodes. A control voltage applied to the gate electrode controls the flow of current through a controllable conductive channel between the source and drain electrodes.

Power transistor devices are designed to be tolerant of the high currents and voltages that are present in switching applications that previously relied upon electromechanical switches. In a conduction (or ON) state, power transistor devices may handle currents that range from several Amperes to several hundred Amperes. The applications may also involve the power transistor devices blocking high voltages during an OFF state, e.g., 25 Volts or more, without breaking down.

One type of power transistor device is a trench FET device. In trench FET devices, the gate electrode is disposed in a trench to form a vertical channel. Unfortunately, trench FET devices are often configured to block high voltages in only one direction between the source (top) and drain (bottom) electrodes. The power transistor device may breakdown at a much lower voltage level if biased in the other direction.

Efforts to develop trench FET devices for bi-directional switch applications have presented tradeoffs. In some cases, the breakdown voltage in one direction may be improved at the expense of a lower breakdown voltage in the other direction. Another tradeoff is between breakdown voltage and the on-state resistance of the device. For example, the breakdown voltage in one or both directions may be improved by increasing the distance between the source and drain electrodes. However, the increased distance establishes a longer conduction path for the device, which leads to an undesirable increase in the on-state resistance.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
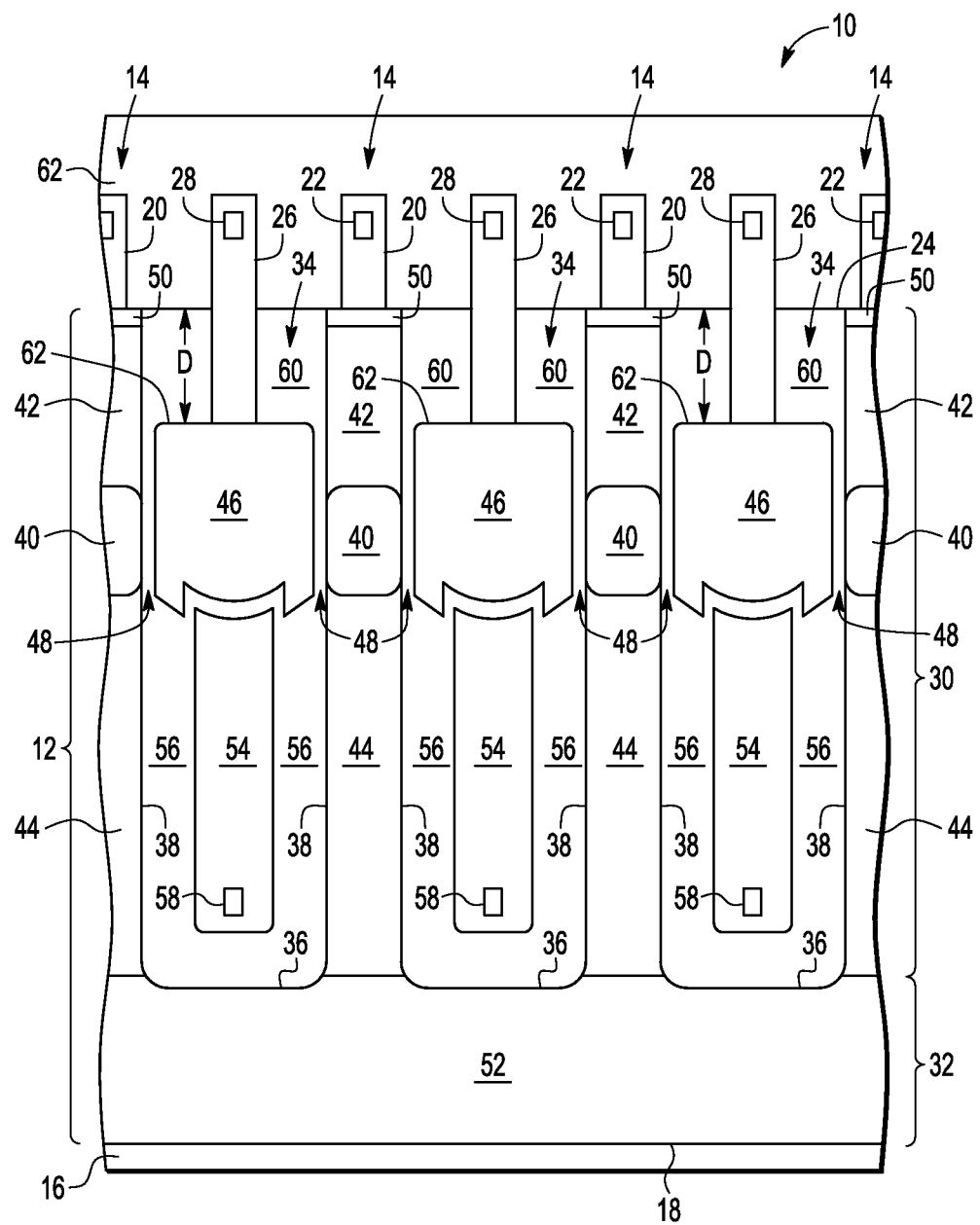
FIG. 1 is a partial, cross-sectional, schematic view of an exemplary trench FET device having a gate structure recessed in accordance with one embodiment.

Embodiments of trench FET and other semiconductor devices and electronic apparatus are described, along with methods of fabricating such devices and apparatus. The semiconductor devices include one or more gate structures positioned to reduce electric field magnitudes along the conduction path of the devices. The gate structures may thus provide a reduced surface field (RESURF) effect, or partial RESURF effect. The RESURF effect may improve a reverse breakdown voltage level (BVr) of the device without detrimental effects or increased fabrication costs. For example, the improvements may be achieved without detrimental effects on the on-state resistance of the device (Rdson) or a forward breakdown voltage level (BVdss) for blocking in the other direction.

Each gate structure is disposed alongside a drift region, e.g., an upper drift region of the device, in addition to being disposed alongside a body region. The gate structure and the drift region vertically overlap. With the gate-drift overlap, each gate structure is thus configured to act as a RESURF structure in addition to controlling formation of a channel in the body region. As a RESURF structure, the gate structure reduces electric field magnitudes in the drift region through application of the gate control voltage. The resulting decrease in the electric field magnitudes may lead to improved breakdown performance. In a trench FET device, the surface at which the electric field magnitude is reduced may be the sidewall of the trench. In operation, the gate control voltage may be at or near ground during conditions in which the device is in a blocking state, e.g., an OFF operational state. Other low voltage levels may be used to establish the RESURF effect, e.g., a low voltage relative to the high operational voltage present at one of the conduction terminals (i.e., the source or drain).

The extent to which the gate structure is recessed from the substrate surface ("the recess distance") may be selected to optimize the reverse breakdown voltage. The reverse breakdown voltage reaches a peak where the RESURF effect is maximized. The reverse breakdown voltage level first increases as the recess distance increases. At this stage, the increases in breakdown voltage level are tied to the overall spacing (e.g., trench dielectric spacing) between the conduction terminal (e.g., the source region in connection with the reverse breakdown level) and the gate structure. The reverse breakdown voltage eventually begins to decrease as the lowering overlap of the gate structure and the drift region decreasingly affects the electric field magnitudes in the drift region. The optimal reverse breakdown voltage may be reached when the trench dielectric and the drift region are supporting the same voltage. The recess distance may thus be selected to reach this optimal reverse breakdown condition.

The gate-drift overlap and other characteristics of the gate structure may be established through the configuration of an etch procedure. The etch procedure may be configured as an over-etch procedure, in which the etching proceeds to an extent that a recess is formed in the layer being etched. In this case, the procedure etches a gate conductive layer disposed in a trench to recess the gate structure from the surface of the semiconductor substrate in which the trench is formed. The gate structure is recessed in the trench to dispose a boundary (e.g., the upper boundary) of the gate structure at a depth between the surface and the body region.

The additional breakdown protection provided by the gate structure may be useful in devices having already been configured to optimize various device operational parameters. For example, the breakdown voltage in one direction (e.g., a forward direction) and other device operational parameters may already be established via the design of various device design configuration features, including, for instance, the depth of the body region, the spacing between the trenches, the doping level of the drift region(s) (e.g., the doping level of one or more epitaxial layers), and the thickness of one or more epitaxial layers. The additional breakdown protection may be achieved without modifying these design features. Incorporation of the recessed gate structure into the device design may thus avoid adverse effects on the device operational parameters. In some cases, however, one or more of the design features may be modified as well. For example, the reverse breakdown voltage level may be further adjusted by changing the doping level of the drift region(s). An additional implantation procedure or epitaxial growth procedure may be used to differentiate the doping concentration levels of the upper and lower drift regions. Other techniques for establishing the doping concentration levels of the drift regions may be used. The extent to which the gate structure is recessed may also be optimized or adapted in accordance with the above-referenced design features, and/or other design features, such as the thickness of the gate dielectric layer.

FIG. 1 is a schematic plan view of an example of a trench FET device 10 constructed in accordance with one embodiment. In this example, the device 10 is configured as an n-channel trench FET device. The device 10 includes a semiconductor substrate 12 in which a number of constituent transistor structures 14 are formed. The transistor structures 14 may be disposed adjacent to one another, and may share one or more components (e.g., gate structures, drain region). The constituent transistor structures may be connected in parallel with one another to establish a discrete FET device. Four transistor structures 14 are shown in full or in part in FIG. 1. The discrete FET device may include hundreds or thousands of the constituent transistor structures 14. The density of the device 10 may vary.

The parallel connection of the constituent transistor structures 14 may involve a number of shared electrodes or terminals. In this example, the device 10 includes a shared or common drain electrode 16 disposed on or otherwise supported by a backside surface 18 of the semiconductor substrate 12. The common drain electrode 16 may include an Ohmic contact interface with the backside surface 18. Electrodes of the transistor structures 14 that are not shared may be connected in parallel with one another via interconnects. In this example, source electrodes 20 are connected by interconnects 22. The source electrodes 20 and the interconnects 22 are disposed on or otherwise supported by a topside surface 24 of the semiconductor substrate 12 opposite from the backside surface 18. Each source electrode 20 may include an Ohmic contact with the topside surface 24. Also disposed at and/or supported by the topside surface 24 in this example are gate electrodes 26 and gate interconnects 28. The gate electrodes 26 may be configured as vias that extend vertically past the surface 24 to electrically connect the interconnects 28 to structures buried in the semiconductor substrate 12.

In other examples, the positions and configuration of the drain electrode(s) 16 and the source electrode(s) 20 may be reversed. The use and location of interconnects may vary accordingly.

The transistor structures 14 may be arranged in an array. Each transistor structure 14 may be disposed at a row-column intersection of the array. The array may have any number of rows and any number of columns. A portion of one row (or column) of the array is shown in FIG. 1. The interconnects of the transistor structures 14 may be disposed along the columns as shown. Other arrangements may be used.

The semiconductor substrate 12 may include a number of epitaxial layers 30 supported by an original or support substrate 32. In this example, the semiconductor substrate 12 includes a single n-type epitaxial layer 30. The original substrate 66 may be a heavily doped n-type substrate. In other cases, the original substrate 66 may be moderately doped. The epitaxial layer 30 and the original substrate 32 are not necessarily drawn to scale in FIG. 1. In some cases, the original substrate 32 may be thinned from an initial thickness after growth of the epitaxial layer(s) 30 and other fabrication procedures. The semiconductor substrate 12 may not include any epitaxial layers, and/or may include layers other than epitaxial layers. The transistor structures 14 may accordingly include regions or structures formed in non-epitaxial layers. Any one or more of the layers or other components of the semiconductor substrate 12 may include silicon. Other semiconductor materials may be used.

The structural, material, and other characteristics of the semiconductor substrate 12 may vary from the example shown. For example, additional, fewer, or alternative layers may be included in the semiconductor substrate 12. The original substrate 32 may or may not be configured as a bulk substrate. In other cases, a silicon-on-insulator (SOI) substrate may be used in connection with, e.g., an up-drain transistor configuration.

Each transistor structure 14 includes one or more trenches 34 in the semiconductor substrate 12. In the example of FIG. 1, each transistor structure 14 may be considered to include a pair of the trenches 34. Each transistor structure 14 may thus share a trench 34 with the adjacent transistor structures 14 on either lateral side thereof. Each trench 34 extends vertically from the topside surface 24 to a bottom 36. In this example, sidewalls 38 of the trenches 34 extend in parallel downward from the topside surface 24.

The trenches 34 have a depth that may correspond roughly with the thickness of the epitaxial layer 30. For example, the depth of each trench 34 may fall in a range from about 3 μm to about 6 μm. Other depths may be used. For example, the depth of the trenches 34 may vary if the semiconductor substrate 12 includes multiple epitaxial layers 30 and/or if additional doping procedures are used.

The other dimensions of each trench 34 may also vary. The lateral width of each trench 34 is shown in FIG. 1 as the distance between the sidewalls 38 of a respective trench 34. For example, the width of each trench 34 may fall in a range from about 0.7 μm to about 1.2 μm. Other lateral widths may be used, as the width may vary in accordance with a number of device operational parameters. For example, the lateral width may vary based on the operational voltage of the device 10. The trenches 34 may extend in the other lateral dimension not shown in FIG. 1 in accordance with the length of the transistor structures 14.

Each transistor structure 14 includes a body region 40 disposed in the semiconductor substrate 12. Each body region 40 may be configured as a buried or deep well region. A channel is formed in each body region 40 during operation for conduction of charge carriers between the source terminal 20 and the drain terminal 16. Each body region 40 is disposed between a respective pair of adjacent trenches 34. In this n-channel example, the body regions 40 are p-type regions. As shown in the example of FIG. 1, the p-type doping of the semiconductor substrate 12 in the body regions 40 may span across the entire lateral spacing between the sidewalls 38 of adjacent trenches 34. Each body region 40 may be a uniform doped region, or include one or more constituent or additional regions between the adjacent trenches 34. For example, additional implantation and/or epitaxial growth procedures may be used to define a non-uniform body region.

Each body region 40 may constitute or include a buried region disposed at a depth that establishes a number of operational parameters of the device 10. For example, the forward breakdown voltage is affected by the distance between the backside surface 18 and a lower boundary of the body region 40. The reverse breakdown voltage is affected by the distance between the topside surface 24 and an upper boundary of the body region 40. Other device parameters are affected by these distances. The depth may be determined by the energy of an implantation procedure used to dope the semiconductor substrate 12.

Each transistor structure 14 of the device 10 includes an upper drift region 42 and a lower drift region 44. The upper drift region 42 is disposed in the semiconductor substrate 12 between the body region 40 and the topside surface 24. The lower drift region 44 is disposed in the semiconductor substrate 12 between the body region 40 and the backside surface 18. In this example, the upper and lower drift regions are n-type regions. In some cases, one or both of the upper and lower drift regions 42, 44 correspond with respective portions of the epitaxial layer 30. In other cases, one or both of the upper and lower drift regions 42, 44 have been additionally doped. The additional doping may be of either conductivity type.

Together with the body region 40, the upper and lower drift regions 42, 44 define a conduction path of the transistor structure 14. In a forward conduction mode, the conduction path begins with charge carriers drifting through the upper drift region 42 under the influence of the drain-source bias voltage. After passing through the channel in the body region 40, the charge carriers then drift through the lower drift region 44 again under the influence of the drain-source bias voltage. The flow of charge carriers proceeds in the opposite direction in the reverse conduction mode.

The length of the conduction path may be determinative of various operational parameters of the device 10. In this example, the length of the conduction path corresponds with the thickness of the epitaxial layer 30. The length of the conduction path may affect the forward and reverse breakdown voltages of the device 10 via the thickness of the upper and drift regions 42, 44. As the thickness of either drift region 42, 44 increases, the drift region 42, 44 is capable of supporting a higher operating voltage difference between the drain and source terminals 16, 20. As described herein, however, the disclosed embodiments may avoid having to rely on such increases in the thickness of the epitaxial layer 30 (or either drift region 42, 44) to improve the blocking capability of the device 10. Avoiding such increases may be useful because the thickness of the epitaxial layer 30 also affects the on-state resistance (e.g., Rdson) of the device 10. As the thickness of the epitaxial layer 30 increases, the conduction path becomes longer, thereby increasing the on-state resistance.

In the example shown in FIG. 1, each upper and lower drift region 42, 44 has a uniform dopant concentration profile. The dopant concentration profile and other characteristics of the upper and lower drift regions 42, 44 may vary. For example, one or both of the upper and lower drift regions 42, 44 may be composite regions including one or more constituent regions of either conductivity type. If the constituent region(s) are regions of the opposite conductivity type (e.g., floating p-type islands), the constituent region(s) may be sized, positioned, and otherwise configured to provide a RESURF effect via the depletion of the upper and/or lower drift region 42, 44.

The device 10 includes a plurality of gate structures 46. Each gate structure 46 is disposed in a respective one of the trenches 34. The gate structures 46 may be recessed or buried within the trenches 34 relative to the topside surface 24. Each gate structure 46 may be shared by two adjacent transistor structures 14. Each gate structure 46 is disposed at a depth to be positioned alongside the body regions 40 of the adjacent transistor structures 14. A control voltage is applied to the gate structures 46 to control formation of the channels in the body regions 40 during operation. In the example of FIG. 1, the control voltage is applied to the gate structures through the gate electrodes 26 and the gate interconnects 28.

When the gate structure 46 is biased, charge carriers (in this case, electrons; alternatively, holes) accumulate in the body regions 40 on either side of the gate structure 46. The charge carriers may accumulate along lateral sides of the body region 40 facing the gate structure 46. In this example, the accumulation of electrons results in a charge inversion in the body region 46 from the p-type body region 46 to an n-type conduction layer or area (or channel) near and along the lateral sides of the body region 40. Once a sufficient amount of the charge carriers accumulate in the channel, charge carriers are capable of flowing from the source region 50 toward the drain region 52 through the channel.

Each gate structure 46 may be a unitary or uniform polysilicon structure. In other cases, the gate structures 46 include alternative or additional conductive materials. For example, the gate structures 46 may have a composite or stacked arrangement involving multiple structures or layers.

The device 10 includes a gate dielectric layer 48 disposed along the sidewall 38 of the trench 34 between the gate structure 46 and the body region 40. In the example of FIG. 1, each transistor structure 14 may thus be considered to include a pair of the gate dielectric layers 48, one for each gate structure 46. The gate dielectric layers 48 may include silicon dioxide and/or any other dielectric material. In the example of FIG. 1, each gate structure 46 is spaced from the body region 40 by the gate dielectric layer 48. Each gate structure 46 may thus span the lateral distance between the gate dielectric layers 48 on the sidewalls 38. Each gate dielectric layer 48 may have a thickness that falls in a range from about 600 Angstroms to about 800 Angstroms. Other thicknesses may be used. For example, the thickness of the gate dielectric layers 48 may vary in accordance with the operating voltages applied to the source and drain terminals 20, 16, and/or the magnitude of the control voltage applied to the gate structures 46.

In the example of FIG. 1, each transistor structure 14 includes a heavily doped source region 50 disposed in the semiconductor substrate 12 at the topside surface 24. Each source region 50 is disposed between the upper drift region 42 of each transistor structure 14 and the topside surface 24. The device 10 also includes a collective drain region 52 disposed in the semiconductor substrate 12 at the backside surface 18. The collective drain region 52 is shared by each of the transistor structures 14. The collective drain 52 is disposed between the lower drift region 44 of each transistor structure 14 and the backside surface 18. The source regions 50 and the collective drain region 52 may not be contiguous with the upper and lower drift regions 42, 44, respectively, as shown. For example, a transition and/or other intervening region(s) may be disposed between the source and drain regions 50, 52 and the upper and lower drift regions 42, 44, respectively.

In other examples, the device 10 may include a collective source region shared by each of the transistor structures 14. Multiple drain regions may also be provided. In the example of FIG. 1, the source and drain regions 50 and 52 are n-type doped portions of the epitaxial layer 30 and the original substrate 32, respectively. The collective drain region 52 may, in some cases, correspond with the entire original substrate 32, or what remains of the original substrate 32 after a thinning procedure. The collective drain region 52 may have an upper boundary positioned roughly at the depth of the bottom 36 of each trench 36.

The source and drain regions 50, 52, or a portion thereof, may have a dopant concentration at a level sufficient to establish Ohmic contacts with the source and drain electrodes or terminals 20, 18. The source and drain regions 50, 52 may be biased for bidirectional operation in either a forward or reverse conduction mode. In the forward conduction mode, the drain region 52 is biased higher than the source regions 50. In the reverse conduction mode, the source regions 50 are biased higher than the drain region 52.

The source and drain regions 50 and 52 are vertically spaced from one another as shown in the cross-section of FIG. 1. The spacing further defines the conduction path of the transistor structure 14. The thickness of the source and drain regions 50, 52 may vary from the example shown. For example, the source and drain regions 50, 52 may have a dopant concentration in which the dopant concentration level varies as a function of depth. The variation in dopant concentration level may establish one or more transition regions along the conduction path.

Any number of source or drain regions 50, 52 may be provided. Other source/drain arrangements may be used. For example, the drain region 52 may not be shared or otherwise disposed between adjacent transistor structures.

The device 10 also includes a plurality of shields 54 disposed in the plurality of trenches 34, respectively. Each shield 54 is disposed below, and spaced from, the gate structure 46 in the trench 34. Each shield 54 is thus disposed alongside a respective one of the lower drift region 44. Also in the trench 34 is a shield dielectric layer 56 disposed along the sidewalls 38 on each lateral side of the shield 54. Each shield 54 may thus be spaced from the lower drift region 44 by the shield dielectric layer 56. The shields 54 may be or include a polysilicon structure. Additional or alternative conductive materials may be used.

The shields 54 may be biased during operation to create an accumulation region in the lower drift region 44. For example, a positive voltage applied to the shields 54 causes electrons to accumulate in the lower drift region 44. The presence of the accumulation region in the lower drift region 44 may increase the switching speed of the device 10.

During operation, the shields 54 may also be biased to provide a RESURF effect in the lower drift region 44. The shields 54 may be biased at a voltage via respective interconnects 58. With each shield 54 at a lower voltage (e.g., ground) than the drain electrode 16, the shield 54 may reduce the electric field magnitudes in the lower drift region 44. The reduction may lead to an increase in the forward breakdown voltage (BVdss) and also protect the gate dielectric layer 48 from damage due to hot carrier injection (HCI).

The shield dielectric layer 56 is thicker than the gate dielectric layer 48. For example, the thickness of the shield dielectric layer 56 may fall in a range from about 2000 Angstroms to about 4000 Angstroms. Other thicknesses or shield dielectric layer arrangements may be used. For example, the shield dielectric layer 56 may not have a uniform thickness as shown.

The shield dielectric layer 56 may be composed of, or include, the same material(s) as the gate dielectric layer 48. For example, the shield dielectric layer 56 may be composed of, or include, silicon dioxide. In the example of FIG. 1, the gate dielectric layer 48 and the shield dielectric layer 56 are accordingly depicted as a continuous dielectric region in the trench 34, even though the gate and shield dielectric layers 48, 56 are separately deposited, grown, or otherwise formed.

Each trench 34 includes an upper trench section 60 disposed above the gate structure 46. The upper trench section 60 may be filled with further dielectric material, such as silicon dioxide. Additional or alternative dielectric materials may be used. The further dielectric material(s) may be deposited during the passivation of the topside surface 24. The passivation may include the deposition, growth, or other formation of one or more dielectric layers 62 on or over the topside surface 24. The upper trench section 60 and the dielectric layer(s) 62 are depicted in FIG. 1 as separate regions for ease in illustration.

The gate structures 46 of the device 10 are configured to provide RESURF effects (or partial RESURF effects) in the upper drift regions 42. The gate structure 46 and the gate dielectric layer 48 have a substantial vertical overlap with the upper drift region 42 (the "gate-drift overlap"). The gate structure 46 and the gate dielectric layer 48 are accordingly disposed alongside the upper drift region 42. In the example of FIG. 1, each gate structure 46 has an upper boundary 62 disposed at a depth between the topside surface 24 and the body region 40. The depth of the boundary 62 may be substantially spaced from the body region 40 and the topside surface 24. As a result of the gate-drift overlap, a RESURF effect in the upper drift region 42 may be provided.

The gate structure 46 and the upper drift region 42 vertically overlap to an extent that electric field magnitudes in the upper drift region 42 are reduced through application of the control voltage to the gate structure 46. The electric field magnitudes may be reduced relative to the prospective or possible magnitudes that would be reached absent the application of the control voltage. The reduction may be useful in a reverse conduction mode, i.e., when the source electrodes 20 are at a higher voltage than the drain electrode 16. In that operational mode, a lower voltage (e.g., ground) applied to the gate structure 46 may lower electric field magnitudes in the upper drift region 42 while the device 10 is tasked with blocking the voltage between the source and drain electrodes 20, 16.

In some cases, the gate-drift overlap may be greater than about 0.2 µm. For example, the gate-drift overlap may fall in a range from about 0.2 µm to about 1.2 µm. The overlap may depend on the epitaxial layer thickness. So other overlap amounts may be used. For example, the amount of gate-drift overlap may vary based on the operating voltage during the reverse conduction mode.

The gate-drift overlap may be considered substantial in multiple ways or aspects. For instance, the gate-drift overlap is greater than that which would be provided for purposes of a fabrication tolerance directed to ensuring formation of the channel across the body region 40. In other trench FET devices, gates may be larger (height-wise) than device bodies to extend beyond the top and bottom of the device body by a fabrication tolerance to ensure that a channel can be formed across the entire vertical extent of the body region 40. Such fabrication tolerances may fall in a range from about 0 µm to about 0.1 µm in such devices. The gate-drift overlap in the transistor structures 14 is greater than such fabrication tolerances. Other examples in which the gate-drift overlap is substantial are set forth below.

The amount of vertical overlap between the gate structures 46 and the upper drift regions 42 may be established by selecting a recess distance D, or depth of, the upper boundary 62 from the topside surface 24. In the example of FIG. 1, the recess distance D is selected such that the depth of the boundary 62 is positioned about halfway between the topside surface 24 and the body region 40 (i.e., the depth of the upper boundary of the body region 40). In some examples, the recess distance D may fall in a range from about 0.65 µm to about 0.8 µm, although recess distances over 1.0 µm may be used. The recess distance may vary based on a number of factors, including, for instance, the operating voltage range of the device 10 and/or the overall thickness of the epitaxial layer 30.

The term "substantial" may be used to characterize the gate-drift overlap or other spacing or distance related to the positioning of the gate structure 46. In that context, an overlap, spacing, or distance may be considered substantial relative to the overall distance between the topside surface 24 and the depth of the upper boundary of the body region 40. For example, a substantial amount of vertical overlap may be greater than about 10% of the overall distance. In some cases, the amount of vertical overlap falls in a range from about 20% to about 60% of the overall distance. Stated conversely, in such cases, the recess distance D falls in a range from about 40% to about 80% of the overall distance and is, thus, also considered substantial.

An overlap, spacing, or distance may alternatively be considered substantial based on whether the on-state resistance (Rdson) of the device 10 changes in a measurable, discernable, or material way from the resistance level provided by a zero or negligible overlap arrangement. As shown in the example data of FIG. 2, the on-state resistance may be affected by changes in the recess distance D, albeit to a small amount. While such small changes in the on-state resistance may not present a problem, the change is nonetheless measurable, discernable, and material. In contrast, for example, a gate-drift overlap directed only to addressing fabrication tolerances may not lead to a measurable or otherwise discernable effect on the on-state resistance relative to a zero gate-drift overlap arrangement. Such gate-drift overlap amounts would accordingly not lead to a material effect on the on-state resistance and, thus, not be considered substantial.

The depth of the boundary 62 may be positioned at about a vertical midpoint of the upper drift region 42. The depth of the boundary 62 may vary from these comparisons. For example, the recess distance D may be selected such that the gate-drift overlap is greater than or about equal to the recess distance D.

The extent of the gate-drift overlap may also be characterized by comparing the vertical extent of the gate structure 46 with the vertical extent of the body region 40. In the example of FIG. 1, the vertical extent of the gate structure 46 (and, thus, the gate dielectric layer 48) is about twice a vertical extent of the body region 40. Other ratios may be present in other examples. For example, the vertical extent of the gate structure 46 and the gate dielectric layer 48 may be greater than twice the vertical extent of the body region 40.

The gate-drift overlap and/or the recess distance D may also be characterized relative to the dimensions of other components of the transistor structure 14. For instance, the vertical overlap and/or the recess distance D may be greater than or about equal to the lateral width of the body region 40. For example, the recess distance D may be about 0.7 to about 1.2 μm, and the lateral width of the body region 40 is about 1.1 μm. Alternatively or additionally, the gate-drift overlap and/or the recess distance D may be greater than or about equal to the lateral width of the trenches 34. For example, the recess distance D may be about 0.7 to about 1.2 μm, and the lateral width of the trench 34 is about 0.8 to about 1.0 μm. Alternatively or additionally, the gate-drift overlap and/or the recess distance D may be greater than or about equal to the thickness of the shield dielectric layer 56. Alternatively or additionally, the vertical overlap and/or the recess distance D may be greater than or about equal to the lateral width of the shield 54.

In the example of FIG. 1, each trench 34 is shield-free along the upper drift region 42. Each trench 34 does not include an upper shield or other conductive structure disposed along the length of the upper drift region 42 to provide a RESURF or other effect on the upper drift region 42. While the gate electrodes 26 extend through the upper trench section 60, the gate electrodes 26 do not provide RESURF or other effects because the gate electrodes 26 may be intermittently placed along the length of the device 10 (the lateral dimension not shown in FIG. 1). In such cases, however, each gate electrode 26 is still not considered an upper shield because the gate electrode 26 is not biased or controlled separately from the gate structure 46. In contrast, each shield 54 is separate and distinct from the gate structures 46 and may thus be controlled independently of the gate control voltage.

Other features and/or characteristics of transistor structures 14 may be included, configured, or used to enhance or otherwise modify the RESURF effect in the upper drift region 42. For example, the upper and lower drift regions 42, 44 may have different dopant concentration levels. The upper drift region 42 may be doped at a different level for purposes of improving the reverse breakdown level by using charge balancing. The upper drift region 42 may have a higher or lower dopant concentration level through an additional doping procedure and/or additional epitaxial growth procedure. For example, the upper drift region 42 may be more highly doped n-type to decrease the on-state resistance. The additional n-type doping may compensate for the increase in on-state resistance arising from the gate-drift overlap. The additional n-type doping may be directed to additional or alternative purposes. In other examples, the upper drift region 42 may be less highly doped n-type to further enhance the RESURF effect. The lower n-type doping may be provided via a p-type implantation procedure (e.g., a boron implant). The additional n-type doping may be provided via an n-type implantation procedure (e.g., a phosphorus implant).

The shape of the gate structures 46 may vary from the example shown in FIG. 1. For instance, the notched shape of the lower boundary of each gate structure 46 is an artifact of the process of forming the shield 54 and the gate dielectric layer 48, which is also deposited or formed on the shields 54.

The above-described transistor structures are shown in simplified form. For example, the devices may have a number of other structures or components for connectivity, isolation, passivation, and other purposes not shown in FIG. 1 for ease in illustration. For instance, the devices may include any number of additional metal layers and corresponding passivation layers disposed in between the metal layers. In some examples, one or more epitaxial layers (not shown) may be included, e.g., disposed between the original substrate and the trenches.

The dopant concentrations, thicknesses (or widths), and other characteristics of the above-described semiconductor regions in the semiconductor substrate 12 may vary. In one example of the embodiment shown in FIG. 1, the above-referenced semiconductor regions may have the following approximate concentrations and thicknesses:

|  | Concentration | Thickness (Width*) |
| --- | --- | --- |
| n-epi 30: | $2 \times 10^{16}$-$5 \times 10^{16}/cm^3$ | 4-7 μm |
| substrate 32: | $1 \times 10^{20}$-$5 \times 10^{21}/cm^3$ | 200-250 μm |
| trench 34: | not applicable | 3-6 μm* |
| body 40: | $1 \times 10^{16}$-$1 \times 10^{18}/cm^3$ | 1.8-3 μm |
| drift 42: | $2 \times 10^{16}$-$5 \times 10^{16}/cm^3$ | 1-2 μm |
| drift 44 (n-epi): | $2 \times 10^{16}$-$5 \times 10^{16}/cm^3$ | 2-5 μm |
| dielectric 48: | not applicable | 0.06-0.08 μm* |
| source 50: | $1 \times 10^{21}$-$5 \times 10^{21}/cm^3$ | 0.15-0.25 μm |
| drain 52 (sub): | $1 \times 10^{21}$-$5 \times 10^{21}/cm^3$ | 196-243 μm |
| shield 54: | not applicable | 0.3-0.8 μm* |
| dielectric 56: | not applicable | 0.2-0.5 μm* |

The concentrations and thicknesses may be different in other embodiments. For example, the dopant concentration of the original substrate 32 may vary considerably.

Figure 2:
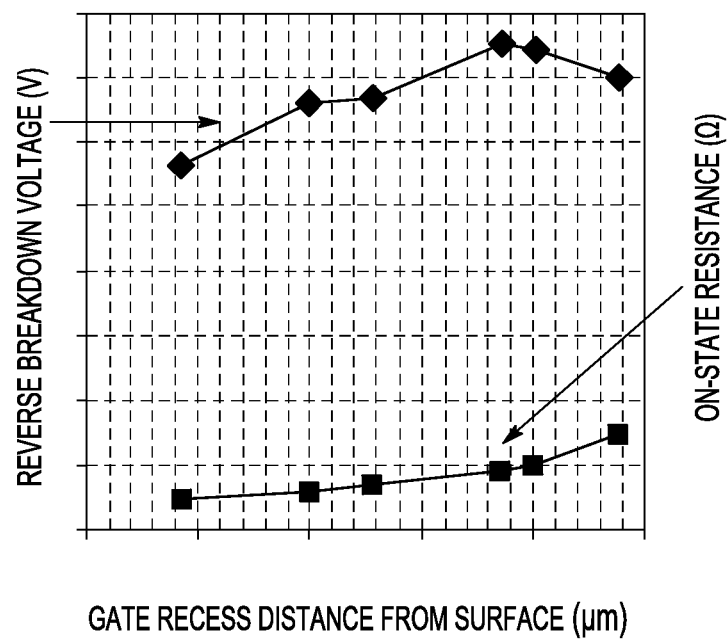
FIG. 2 is a graphical plot depicting reverse breakdown voltage and on-state resistance levels as a function of gate recess distance for an exemplary trench FET device constructed in accordance with one embodiment.

FIG. 2 is a graphical plot depicting the effects of the recess and gate-drift overlap of the gate structure. The reverse breakdown voltage level and on-state resistance are plotted as a function of the recess distance D. The on-state resistance tends to increase slightly as the recess distance D increases. In contrast, the reverse breakdown voltage reaches a peak where the RESURF condition established by the recess and gate-drift overlap is maximized. At low recess distances, the gate-drift overlap helps to prevent breakdown within the drift region, but the breakdown voltage level may nonetheless be low because a small amount of trench dielectric material (e.g., trench oxide) is forced to support the high potential difference between the source and gate terminals. As the recess distance D increases, breakdown is less likely to occur via the trench dielectric material. Once the peak is reached, the breakdown voltage level may then decrease as the effects of the gate-drift overlap (e.g., via the control voltage on the gate structure 46) are diminished.

Figure 3:
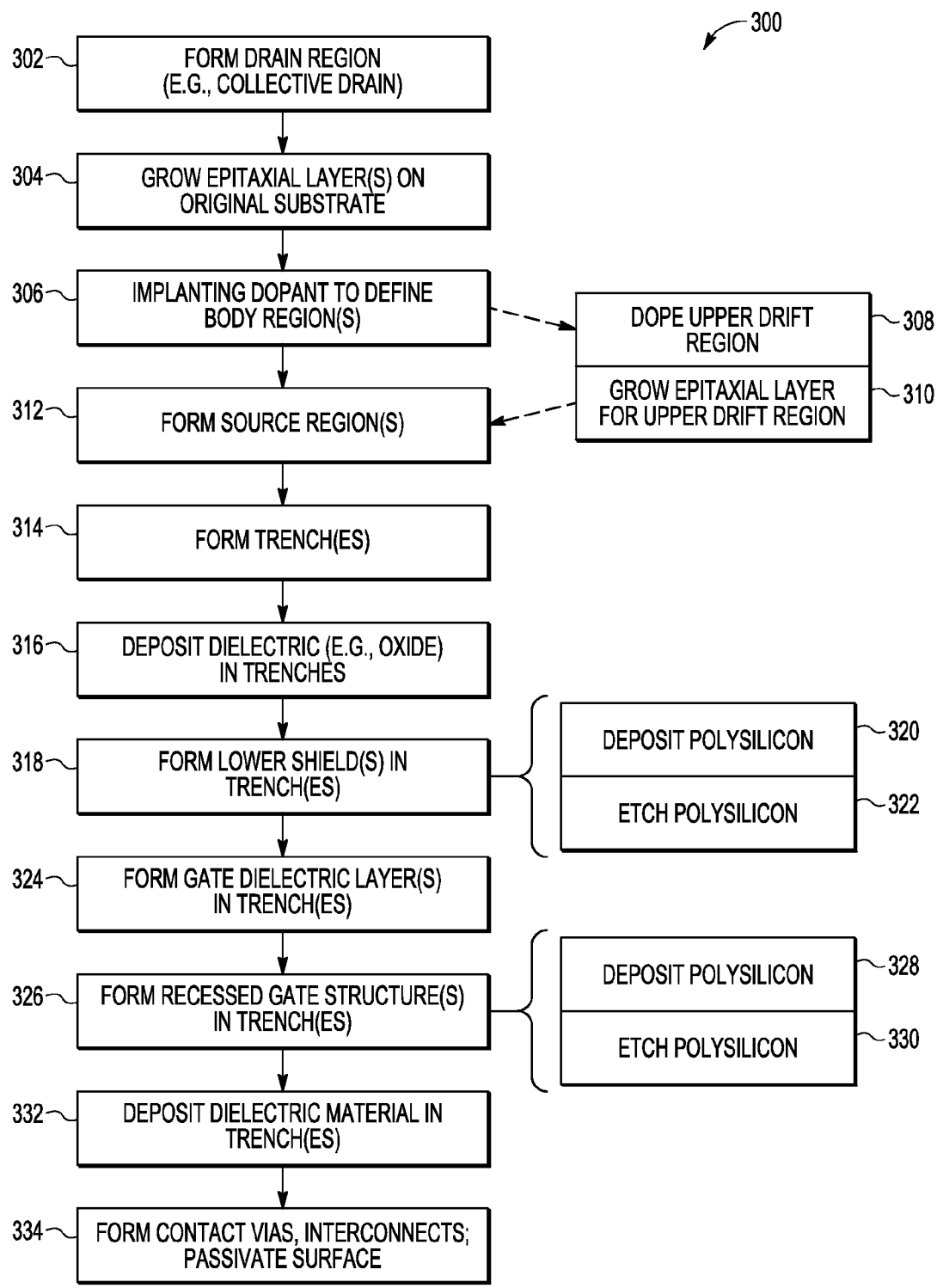
FIG. 3 is a flow diagram of an exemplary fabrication sequence to construct a trench FET device having a recessed gate structure in accordance with one embodiment.

FIG. 3 shows an exemplary fabrication method 300 for fabricating a device with improved breakdown performance, as described above. The method may be directed to fabricating a bidirectional trench FET device. The reverse breakdown voltage level may be improved without adversely affecting the forward breakdown voltage level, without significant increases in on-state resistance, or without increases in fabrication costs.

The device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, an implant procedure to dope upper drift regions may be implemented before the formation of body regions, effectively reordering acts 306 and 308. The fabrication method is not limited to any particular doping mechanism, and may include future developed doping techniques.

The method may begin with, or include, act 302 in which a drain region is formed in or on an original semiconductor substrate. The original substrate may be an SOI or bulk substrate. The drain region may be a collective drain region that extends, unpatterned, across the entire lateral extent of the substrate. The formation of the drain region may include one or more procedures to dope the substrate. For example, a contact portion of the drain region may be formed in the act 302 to establish a dopant concentration level at the backside surface of the substrate sufficient to support an Ohmic contact.

In some cases, the method does not include the act 302. For example, the substrate may already have a suitable n-type dopant concentration level. The substrate may be a heavily doped n-type substrate. Alternatively, the formation of the drain region may not involve any further doping. In such cases, the formation of the drain region may include one or more other procedures directed to modifying (e.g., thinning) the substrate.

In act 304, an n-type epitaxial layer is grown on the original substrate. The epitaxial layer may be grown to define a topside surface of the semiconductor substrate and to establish a dopant concentration level of one or more drift regions of the device. The epitaxial layer may extend across the entire lateral extent of the substrate. In some cases, the act 304 includes the growth of multiple n-type epitaxial layers. Any number of epitaxial layers may be grown. The multiple epitaxial layers may have different dopant concentration levels. The dopant concentration level of the upper and lower drift regions may be established via the growth of the epitaxial layer(s).

One or more body regions are defined or formed in act 306. In this example, a dopant implantation procedure is performed to implant p-type dopant in the substrate. The energy of the implantation procedure is selected to configure each body region as a buried well region.

In some cases, the implantation procedure also effectively defines one or more drift regions. The body region defines a boundary with a drift region (e.g., an upper drift region) disposed between the body region and a surface of the semiconductor substrate. The body region may also define another drift region (e.g., a lower drift region) disposed between the body region and the drain region. For example, upper and/or lower drift regions may be defined as those areas in the substrate not doped by the body implantation procedure. In other cases, one or both of the drift regions are further defined by one or more additional procedures. For example, the upper drift region(s) may be further defined by an n-type implantation or other doping procedure in act 308 and/or through the growth of an additional epitaxial layer in act 310. The additional procedures in acts 308 and 310 may be performed either before or after formation of the body region(s). The upper and lower drift regions may be doped in any one or more ways to establish different dopant concentration levels for the upper and lower drift regions.

In act 312, one or more source region(s) are formed in the substrate. The source regions may be formed with one or more dopant implantation or other doping procedures. In this example, each source region is a highly doped n-type region at the topside surface of the semiconductor substrate. The location of the source region(s) may vary. The order in which the substrate is doped to form the source region(s) and other regions may vary from the example of FIG. 3.

One or more trenches are formed in the substrate in act 314. The trench may be formed via an etching procedure. The configuration of the etching procedure may vary. For example, a variety of different wet and/or dry etchants may be used. Each trench extends vertically from the surface of the semiconductor substrate. Each trench is disposed laterally adjacent to the body region and the drift regions.

In act 316, a shield dielectric layer is deposited in the trench(es). The shield dielectric layer may be deposited, grown, and/or otherwise formed. In some examples, the shield dielectric layer includes silicon dioxide. The shield dielectric layer is disposed in the trench along a sidewall of the trench. The shield dielectric layer has a thickness greater than a gate dielectric layer to be subsequently formed.

After the deposition of the shield dielectric layer, a lower shield is formed in each trench in act 318. The lower shield may thus be deposited on, or otherwise adjacent to, the shield dielectric layer. For example, the act 318 may include deposition of polysilicon in an act 320 and an etching procedure in act 322. The etching procedure may establish a height of the lower shield within the trench.

In act 324, a gate dielectric layer is formed in each trench. The gate dielectric layer may be deposited, grown, and/or otherwise formed. The gate dielectric layer is formed in the trench along the sidewall of the trench. The gate dielectric layer may also be formed on or over the top of the lower shield. The gate dielectric may thus electrically isolate the lower shield from a gate structure to be formed in the trench.

After the gate dielectric layer is formed, one or more recessed gate structures are formed in act 326. Each gate structure is formed in a respective trench adjacent the gate dielectric layer and alongside the body region. To form the gate structure, a gate conductive layer may be deposited and etched to recess the gate structure from the surface of the substrate to an extent that the gate structure and the gate dielectric layer have a substantial vertical overlap with the upper drift region. As a result of the gate-drift overlap, electric field magnitudes in the upper drift region are reduced through application of a control voltage to the gate structure during operation. In the example of FIG. 3, the act 326 includes deposition and etching of a polysilicon layer in acts 328, 330.

The recessed gate structure has a boundary disposed at a depth between the topside surface of the substrate and the body region. The depth of the boundary may be positioned about halfway between the surface and the body region. The boundary depth and gate-drift overlap may vary as described above.

Further dielectric material may be deposited in each trench in act 332. The further dielectric material may be deposited on or over each gate structure. The further dielectric material may include silicon dioxide. The further dielectric material may be deposited in connection with the passivation of the topside surface of the substrate. Alternatively, the passivation of the topside surface may be implemented separately.

A number of procedures may then be performed in act 334 to define a number of structures and/or layers on or otherwise supported by the topside surface. The structures may include contacts, contact vias, interconnects, and/or other conductive structures. The conductive structures may be used to define and/or interconnect electrodes of the device, including, for instance, gate and source electrodes. Each conductive structure may include one or more metal layers, e.g., a metal stack.

The act 334 may also include the deposition or other formation of one or more dielectric layers. The dielectric layers may be used to passivate the topside surface of the substrate and/or electrically isolate the conductive structures. The materials, arrangement, and number of dielectric layers may vary.

The act 334 may also include the definition of structures and/or layers on or otherwise supported by the backside surface of the substrate. For example, one or more backside contact metal layers may be deposited to define the drain electrode of the device. The backside structures and/or layers may be deposited and/or formed after a backside thinning procedure.

Additional acts may be implemented at various points during the fabrication procedure. For example, a number of acts may anneal the substrate to reposition the dopant ions in the drift or other regions and to repair the substrate after implantation procedures. Other examples of additional acts include depositing and defining one or more metal and passivation layers supported by the substrate.

In a first aspect, a device includes a semiconductor substrate having a surface, a trench in the semiconductor substrate extending vertically from the surface, a body region disposed in the semiconductor substrate laterally adjacent the trench, spaced from the surface, having a first conductivity type, and in which a channel is formed during operation, a drift region disposed in the semiconductor substrate between the body region and the surface, and having a second conductivity type, a gate structure disposed in the trench alongside the body region, recessed from the surface, and configured to receive a control voltage to control formation of the channel during operation, and a gate dielectric layer disposed along a sidewall of the trench between the gate structure and the body region. The gate structure and the gate dielectric layer have a substantial vertical overlap with the drift region such that electric field magnitudes in the drift region are reduced through application of the control voltage.

In a second aspect, a bidirectional trench FET device includes a semiconductor substrate having a topside surface and a backside surface opposite from the topside surface, and a plurality of transistor structures disposed in the semiconductor substrate. Each transistor structure includes a trench extending vertically from the topside surface, a body region adjacent the trench, having a first conductivity type, and in which a channel is formed during operation, an upper drift region disposed between the body region and the topside surface and having a second conductivity type, a lower drift region disposed between the body region and the backside surface and having the second conductivity type, a gate structure disposed in the trench alongside the body region, and configured to receive a control voltage to control formation of the channel during operation, a shield disposed in the trench and spaced from the gate structure, a gate dielectric layer disposed along a sidewall of the trench between the gate structure and the body region, and a further dielectric layer disposed along the sidewall between the shield and the lower drift region, the further dielectric layer being thicker than the gate dielectric layer. The gate structure has a boundary disposed at a depth between the topside surface and the body region. The depth is substantially spaced from the body region such that the gate structure and the gate dielectric layer are disposed alongside the upper drift region such that electric field magnitudes in the upper drift region are reduced through application of the control voltage, the electric field magnitudes being reduced relative to prospective electric field magnitudes reached in the upper drift region absent the application of the control voltage.

In a third aspect, a method of fabricating a device includes implanting dopant of a first conductivity type to form a body region buried in a semiconductor substrate, the body region defining a boundary with a drift region disposed between the body region and a surface of the semiconductor substrate, forming a trench in the semiconductor substrate that extends vertically from the surface of the semiconductor substrate, the trench being disposed laterally adjacent to the body region and the drift region, forming a gate dielectric layer in the trench along a sidewall of the trench, and forming a gate structure in the trench adjacent the gate dielectric layer and alongside the body region. Forming the gate structure includes etching a gate conductive layer to recess the gate structure from the surface of the semiconductor substrate to an extent that the gate structure and the gate dielectric layer have a substantial vertical overlap with the drift region such that electric field magnitudes in the drift region are reduced through application of a control voltage to the gate structure during operation.

Although described in connection with power semiconductor devices and applications, the disclosed embodiments are not limited to any particular transistor configuration or application. For instance, one or more features of the disclosed embodiments may be incorporated into devices configured for a variety of operating voltage levels. One or more features of the disclosed embodiments may also be applied to other devices and/or device configurations. For instance, the disclosed devices may include various RESURF structures in addition or alternative to the RESURF structural arrangements described herein. For example, floating RESURF islands or other RESURF structures may be incorporated into one or both of the drift regions.

For convenience of description and without any intended limitation, n-channel trench FET devices are described and illustrated herein. However, the disclosed devices are not limited to n-channel devices, as p-channel and other types of devices may be provided by, for example, substitution of semiconductor substrate and/or regions of opposite conductivity type. Thus, for example, each semiconductor region, layer or other structure in the examples described below may have a conductivity type (e.g., n-type or p-type) opposite to the type identified in the examples below.

Although described in connection with discrete semiconductor device arrangements, the semiconductor devices described herein are not limited to any particular type of circuit or other arrangement. For example, the disclosed embodiments are not limited to discrete device arrangements involving a number of constituent transistor structures, or cells, connected in parallel. The semiconductor devices may be or be incorporated in a variety of different discrete and integrated circuit arrangements. The semiconductor devices may thus be useful in connection with a wide variety of contexts.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

Embodiments of the present invention are defined by the following claims and their equivalents, and nothing in this section should be taken as a limitation on those claims. Further aspects and advantages of the invention are discussed above in conjunction with the preferred embodiments and may be later claimed independently or in combination.

While the disclosure has described various embodiments, it should be understood that many changes and modifications may be made without departing from the scope of the disclosure. It is therefore intended that the foregoing detailed description be regarded as illustrative rather than limiting, and that it be understood that it is the following claims, including all equivalents, that are intended to define the spirit and scope of this disclosure.

The invention claimed is:

1. A device comprising:
a semiconductor substrate having a surface;
a trench in the semiconductor substrate extending vertically from the surface;
a body region disposed in the semiconductor substrate laterally adjacent the trench, spaced from the surface, having a first conductivity type, and in which a channel is formed during operation;
a drift region disposed in the semiconductor substrate between the body region and the surface, and having a second conductivity type;
a gate structure disposed in the trench alongside the body region, recessed from the surface, and configured to receive a control voltage to control formation of the channel during operation; and
a gate dielectric layer disposed along a sidewall of the trench between the gate structure and the body region;
wherein the gate structure and the gate dielectric layer have a substantial vertical overlap with the drift region such that electric field magnitudes in the drift region are reduced through application of the control voltage.

2. The device of claim 1, wherein:
the gate structure has a boundary disposed at a depth between the surface and the body region; and
the depth of the boundary is positioned about halfway between the surface and the body region.

3. The device of claim 1, wherein:
the gate structure has a boundary disposed at a depth between the surface and the body region; and
the depth of the boundary is positioned at about a midpoint of the drift region.

4. The device of claim 1, wherein a vertical extent of the gate structure and the gate dielectric layer is greater than or about equal to twice a vertical extent of the body region.

5. The device of claim 1, wherein the substantial vertical overlap is greater than or about equal to a width of the body region.

6. The device of claim 1, wherein the substantial vertical overlap is greater than a fabrication tolerance directed to ensure formation of the channel across the body region.

7. The device of claim 1, further comprising:
a further drift region disposed between the body region and a backside surface of the semiconductor substrate and having the second conductivity type; and
a shield structure disposed in the trench adjacent the further drift region and spaced from the gate structure, wherein:
the trench comprises a further dielectric layer between the shield structure and the further drift region; and
the further dielectric layer is thicker than the gate dielectric layer.

8. The device of claim 7, wherein the first-named and further drift regions have different dopant concentration levels.

9. The device of claim 7, wherein the trench is shield-free along the first-named drift region.

10. A bidirectional trench field effect transistor (FET) device comprising:
a semiconductor substrate having a topside surface and a backside surface opposite from the topside surface; and
a plurality of transistor structures disposed in the semiconductor substrate, each transistor structure comprising:
a trench extending vertically from the topside surface;
a body region adjacent the trench, having a first conductivity type, and in which a channel is formed during operation;
an upper drift region disposed between the body region and the topside surface and having a second conductivity type;
a lower drift region disposed between the body region and the backside surface and having the second conductivity type;
a gate structure disposed in the trench alongside the body region, and configured to receive a control voltage to control formation of the channel during operation;
a shield disposed in the trench and spaced from the gate structure;
a gate dielectric layer disposed along a sidewall of the trench between the gate structure and the body region; and
a further dielectric layer disposed along the sidewall between the shield and the lower drift region, the further dielectric layer being thicker than the gate dielectric layer;
wherein the gate structure has a boundary disposed at a depth between the topside surface and the body region, the depth being substantially spaced from the body region such that the gate structure and the gate dielectric layer are disposed alongside the upper drift region such that electric field magnitudes in the upper drift region are reduced through application of the control voltage, the electric field magnitudes being reduced relative to prospective electric field magnitudes reached in the upper drift region absent the application of the control voltage.

11. The bidirectional trench FET device of claim 10, wherein the depth of the boundary is positioned about halfway between the topside surface and the body region.

12. The bidirectional trench FET device of claim 10, wherein the depth of the boundary is positioned such that the gate structure extends beyond the body region to an extent greater than or about equal to a thickness of the further dielectric layer.

13. The bidirectional trench FET device of claim 10, wherein the depth of the boundary is positioned such that the gate structure extends beyond the body region to an extent greater than or about equal to a lateral width of the shield.

14. The bidirectional trench FET device of claim 10, wherein the trench does not include an upper shield disposed along the upper drift region.

15. A method of fabricating a device in a semiconductor substrate, the method comprising:
    implanting dopant of a first conductivity type to form a body region buried in the semiconductor substrate, the body region defining a boundary with a drift region disposed between the body region and a surface of the semiconductor substrate;
    forming a trench in the semiconductor substrate that extends vertically from the surface of the semiconductor substrate, the trench being disposed laterally adjacent to the body region and the drift region;
    forming a gate dielectric layer in the trench along a sidewall of the trench; and
    forming a gate structure in the trench adjacent the gate dielectric layer and alongside the body region;
    wherein forming the gate structure comprises etching a gate conductive layer to recess the gate structure from the surface of the semiconductor substrate to an extent that the gate structure and the gate dielectric layer have a substantial vertical overlap with the drift region such that electric field magnitudes in the drift region are reduced through application of a control voltage to the gate structure during operation.

16. The method of claim 15, wherein:
    the gate structure has a boundary disposed at a depth between the surface and the body region; and
    the depth of the boundary is positioned about halfway between the surface and the body region.

17. The method of claim 15, further comprising, before forming the gate dielectric layer:
    depositing a further dielectric layer along the sidewall of the trench, the further dielectric layer being thicker than the gate dielectric layer;
    forming a shield in the trench adjacent to the further dielectric layer.

18. The method of claim 15, further comprising growing an epitaxial layer to define the surface of the semiconductor substrate and establish a dopant concentration level of the drift region.

19. The method of claim 18, wherein the dopant concentration level of the drift region is different than a dopant concentration level of a region of the semiconductor substrate below the body region through which charge carriers drift during operation.

20. The method of claim 15, further comprising doping the drift region to establish a different dopant concentration level for the drift region relative to a region of the semiconductor substrate below the body region through which charge carriers drift during operation.

* * * * *